(12) United States Patent
Maurelli et al.

(10) Patent No.: US 6,350,637 B1
(45) Date of Patent: Feb. 26, 2002

(54) METHOD OF FABRICATION OF A NO-FIELD MOS TRANSISTOR

(75) Inventors: Alfonso Maurelli, Sulbiate; Paola Zabberoni, Monza, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/543,400

(22) Filed: Apr. 5, 2000

(30) Foreign Application Priority Data

Apr. 6, 1999 (EP) .............................. 99830194

(51) Int. Cl.⁷ ................... H01L 21/336; H01L 21/8234
(52) U.S. Cl. .................. 438/197; 438/305; 438/286; 438/298; 438/450
(58) Field of Search ................ 438/197, 305, 438/234, 286, 217, 225, 289, 275, 287, 257, 298, 450; 257/378, 903, 315–324, 500, 501

(56) References Cited

U.S. PATENT DOCUMENTS

| 5,396,096 A | 3/1995 | Akamatsu et al. | 257/336 |
| 5,556,798 A | * 9/1996 | Hong | 438/257 |

FOREIGN PATENT DOCUMENTS

| EP | 0 373 631 | 6/1990 | |
| JP | 62229880 | * 10/1987 | H01L/29/78 |
| JP | 62 229880 | 10/1987 | |
| JP | 63 305562 | 12/1988 | |
| JP | 04 254381 | 9/1992 | |

OTHER PUBLICATIONS

Oishi, T. et al., "Noticeable Enhancement of Edge Effect in Short Channel Characteristics of Trench–Isolated MOS-FETs," *International Conference on Solid State Devices and Materials, JA, Japan Society of Applied Physics*, Sep. 1998, pp. 86–87.

* cited by examiner

Primary Examiner—Matthew Smith
Assistant Examiner—Igwe U. Anya
(74) Attorney, Agent, or Firm—Lisa Jorgenson; E. Russell Tarleton; Seed IP Law Group PLLC

(57) ABSTRACT

Method of fabrication of a no-field transistor with no extra process costs, providing for defining an active area for the transistor surrounded by a thick field oxide layer, insulatively placing a polysilicon gate electrode across the active area to define source/drain regions of the no-field transistor, providing an implant protection mask over a boundary between at least one of the source/drain regions and the field oxide layer, selectively implanting in said source/drain regions a relatively heavy dose of dopants to form relatively heavily doped source/drain regions and to simultaneously dope the polysilicon gate electrode, the polysilicon gate electrode formed with lateral wings extending towards the at least one source/drain region, and the implant protection mask extending over the lateral wings but not over the polysilicon gate.

11 Claims, 2 Drawing Sheets

METHOD OF FABRICATION OF A NO-FIELD MOS TRANSISTOR

TECHNICAL FIELD

The present invention relates to the field of integrated circuits, such as memory device chips. More specifically, the invention relates to MOS transistors capable of sustaining relatively high voltages.

BACKGROUND OF THE INVENTION

The improvements in integrated circuit manufacturing technology allow for a fast scaling down of the minimum achievable dimensions. This reflects on the operating voltages, which more or less decrease with the decrease of the minimum achievable dimension.

However, in some integrated circuits, such as non-volatile memory chips, the operating voltages necessary to perform particular operations, such as memory writing, do not decrease as fast as the minimum achievable dimension. In such integrated circuits, there is therefore the necessity of providing particular transistors, referred to as "high-voltage" transistors, that are capable of handling the relatively high voltages required for performing such particular operations. These high-voltage transistors are specifically designed to have a gate oxide suitably thicker than the gate oxide of the "low voltage" transistors of the remaining circuitry and dedicated channel profiles.

Other measures may be taken for realizing high-voltage transistors with the desired performance. For example, the doping levels of the source/drain regions are kept relatively low, in particular at the boundary between the source/drain regions and the field oxide, so that the breakdown voltage of the source/drain-to-substrate junctions is sufficiently higher than the memory writing voltage.

High-voltage transistors of the above type are also called "no field" transistors.

The provision of no field transistors requires modifications to the source/drain mask layout.

Specific additional problems arise when the manufacturing process provides for using the same dopant implantation forming the source/drain regions that are used for doping the polysilicon transistor gate, as in the case of processes for the integration of fast logic circuitry with non-volatile memories.

FIGS. 1 and 2 are top-plan views showing two of the most common techniques for obtaining no-field transistors.

In FIG. 1, reference numeral I denotes a portion of an integrated circuit wherein a no-field transistor is to be formed. Reference numeral 2 denotes the boundary of an active area portion of the circuit inside which the no-field transistor is formed; in other words, outside the boundary 2 a thick field oxide layer 3 is provided. A polysilicon strip 4 crosses the active area portion. The polysilicon strip 4 forming a gate electrode of the no-field transistor is separated from an underlying silicon substrate by means of a gate oxide layer. The polysilicon strip 4, and the underlying gate oxide, divides the active area portion in two regions 5, wherein the source/drain regions of the no-field transistor are formed. The region of the active area under the polysilicon gate forms a channel region of the no-field transistor.

The source/drain regions are normally relatively heavily doped N or P, formed by means of a relatively high dose dopant implant. In order to prevent the relatively high dose implant to extend up to the boundary 2 of the active area portion, an implant mask 6 is used which protects a region of the active area portion near the boundary 2 with the thick field oxide layer 3.

The requirements for designing the implant mask 6 are the definition of the rules of overlapping of the protected zone towards the field oxide layer 3 and towards the gate 4. In particular, the overlapping of the protected zone towards the gate 4 is critical when the polysilicon forming the gate is doped by the same implant used to form the source/drain regions. The region of overlapping of the implant mask 6 with the gate 4 must be negligible compared to the length L of the transistor, otherwise locally a transistor will form with features different from the expected ones. This inevitably leads to an increase in the transistor's length L, thus to a loss of performance and area. For these reasons, this technique is almost made impractical by the current layout rules.

The other commonly-used technique, depicted in FIG. 2 where identical reference numerals are used to denote similar elements, provides for covering the boundary 2 of the active area portion with the polysilicon layer which forms the gate 4 of the transistor. Since the definition of the polysilicon layer precedes the dopant implantation for the formation of the source/drain regions, the technique of FIG. 2 achieves the same result as that of FIG. 1, i.e., keeping the source/drain regions spaced apart from the boundary 2 of the active area.

This technique is not affected by the problems of the previous technique described above with respect to FIG. 1. However, it is known that the corners of the active area, that is the corners of the field oxide layer 3, are highly stressed and more probably subject to defects, so that the intersection of a polysilicon layer with the corners of the active area is to be avoided.

SUMMARY OF THE INVENTION

In view of the state of the art previously described, the disclosed embodiments of the present invention provide a method of fabrication of a no-field transistor that is not affected by the above-mentioned disadvantages.

According to the embodiments of the present invention, a method of fabrication of a no-field transistor is disclosed, providing for defining an active area for the transistor surrounded by a thick field oxide layer, insulatively placing a polysilicon gate electrode across the active area to define source/drain regions of the no-field transistor, providing an implant protection mask over a boundary between at least one of the source/drain regions and the field oxide layer, selectively implanting in said source/drain regions a relatively heavy dose of dopants to form relatively heavily doped source/drain regions and to simultaneously dope the polysilicon gate electrode. The polysilicon gate electrode is formed with lateral wings extending towards said at least one source/drain region, and in that said implant protection mask extends over said lateral wings but not over the polysilicon gate.

An advantage of the present invention resides in that it does not involve additional costs for the manufacturing of the no-field transistors.

BRIEF DESCRIPTION OF THE DRAWINGS

The features and advantages of the present invention will be made apparent by the following detailed description of one practical embodiment thereof, illustrated by way of a non-limiting example in the annexed drawings, wherein.

DETAILED DESCRIPTION OF THE INVENTION

Figure 2:
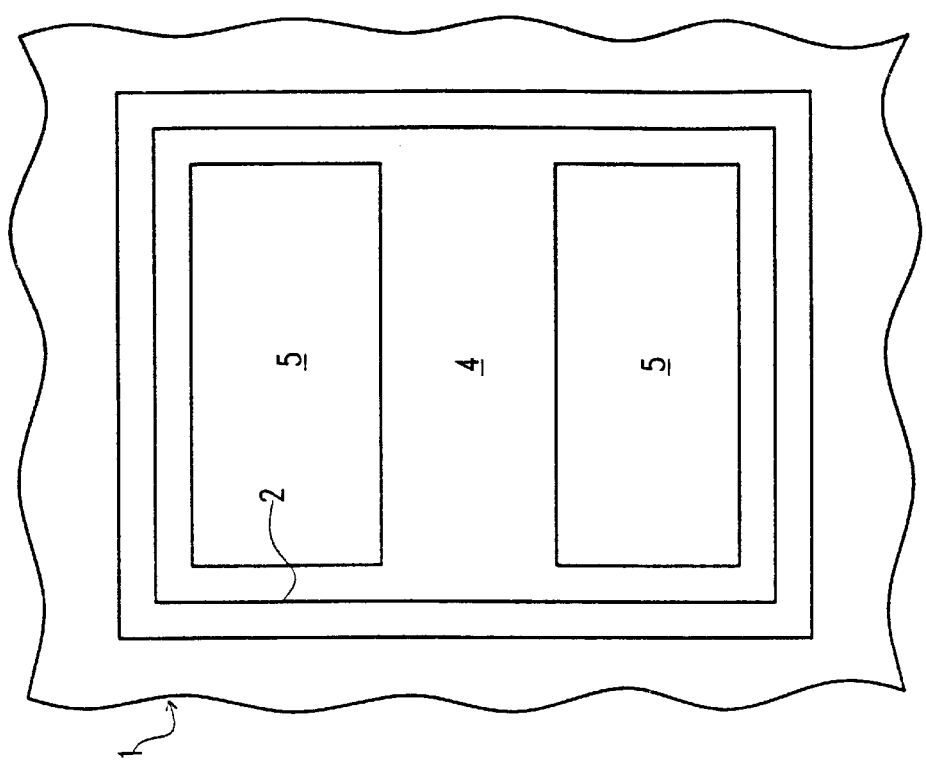
FIG. 2 is a top-plan view of a no-field transistor formed according to a second conventional technique.
Figure 1:
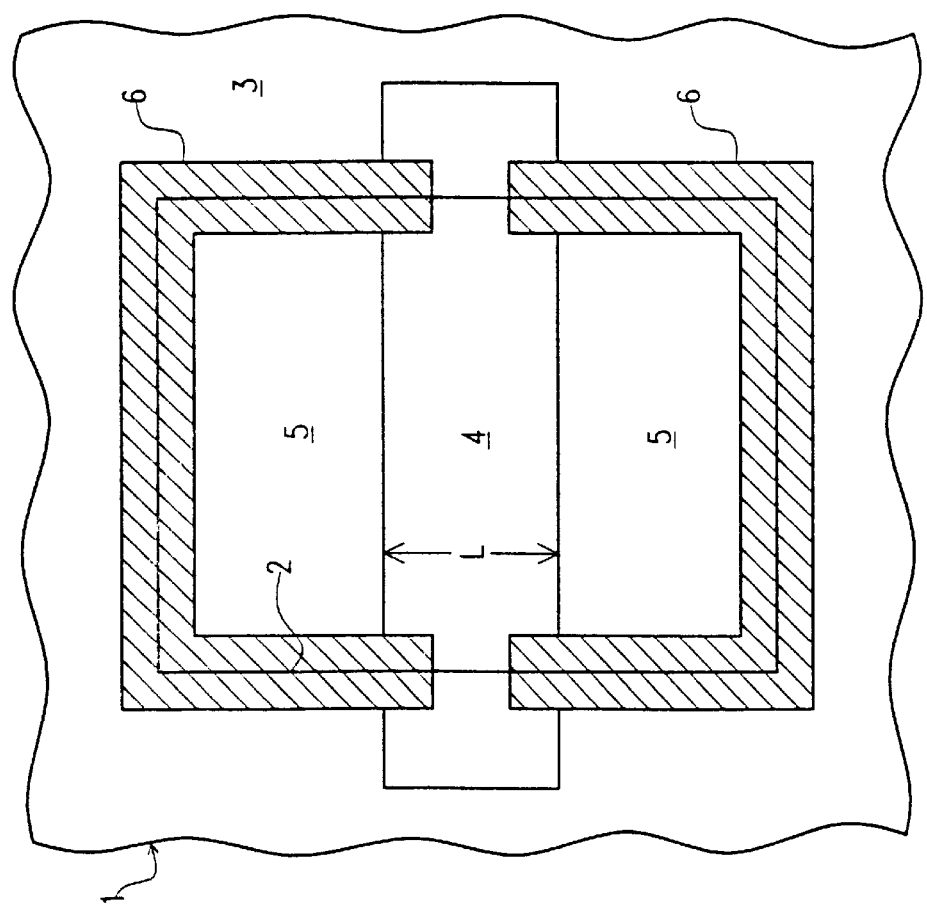
FIG. 1 is a top-plan view of a no-field transistor formed according to a first conventional technique.
Figure 3:
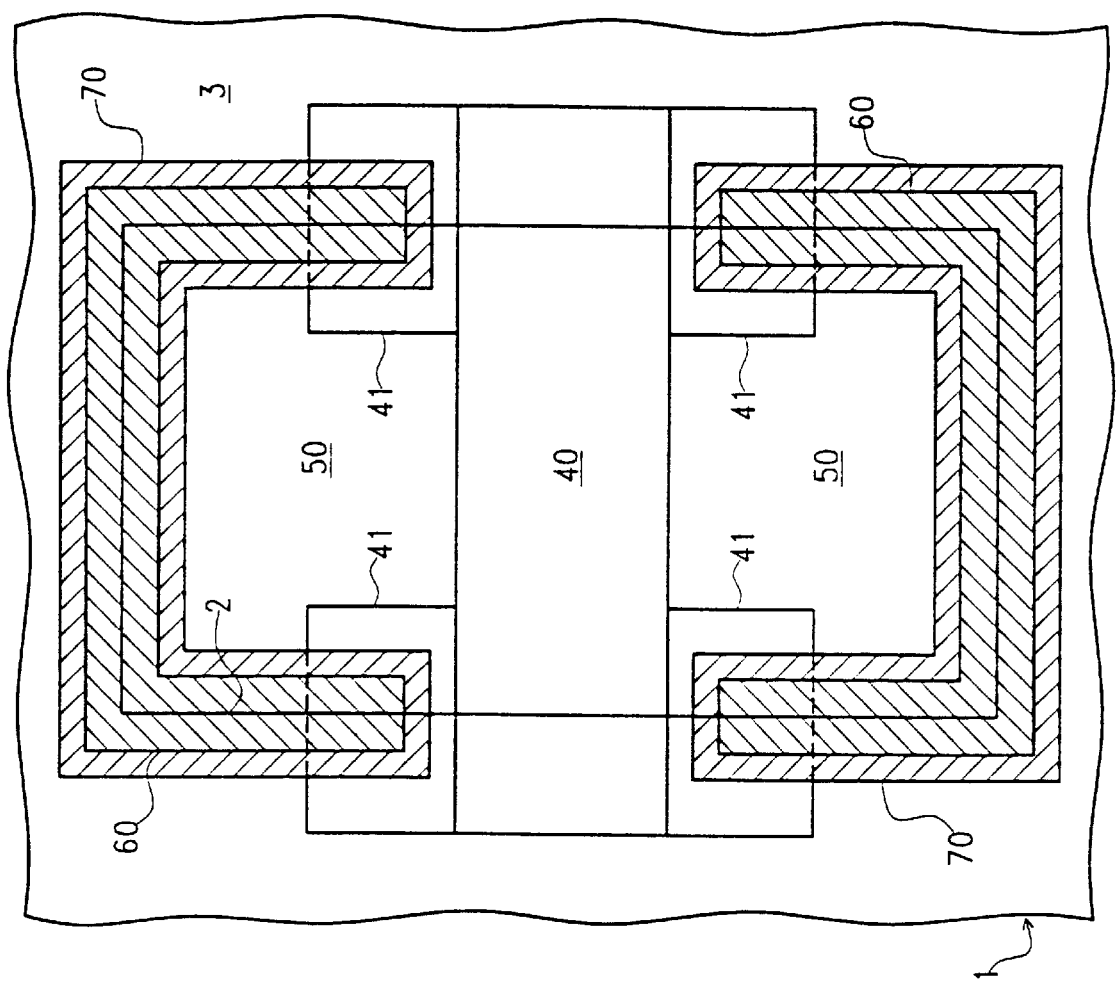
FIG. 3 is a top-plan view of a no-field transistor formed according to an embodiment of the present invention.

Referring to FIG. 3, a top-plan view of a portion 1 of an integrated circuit wherein a no-field transistor is formed is shown therein. The transistor is formed in an active area portion delimited by a boundary 2 which is the boundary of a thick field oxide layer 3 surrounding the active area portion. A polysilicon strip 40 crosses the active area portion, and partially extends over the thick field oxide layer 3. Conventionally, under the polysilicon strip 40, a gate oxide layer, thinner than the thick field oxide, is provided, to form a gate of the no-field transistor.

The polysilicon strip 40 has four lateral extensions or wings 41, which overlap in part the active area portion, and in part the contiguous field oxide layer 3.

The polysilicon strip 40 divides the active area portion in two regions 50, where the source/drain regions of the no-field transistor will be formed.

In order to form the source/drain regions of the no-field transistor, a relatively high dose of an N type or P type dopant is implanted into regions 50, the dopant type depending on the type of transistor to be formed.

Before performing such an implantation, an implant protective mask 60 is applied. Such a mask is not an extra mask, because in any conventional CMOS process the source/drain implantations ask for a specific mask to separate N and P regions for the N-and P-channel devices. With respect to the conventional mask, only a dedicated layout is needed to realize the described embodiment. Mask 60 covers the boundary 2 of the thick field oxide layer 3 and slightly extends over the wings 41. Then, the relatively heavy dose implant of dopant is performed to form the source/drain regions of the no-field transistor. Mask 60 prevents the dopant from being implanted near the boundary 2 of the active area portion, i.e., near the boundary of the thick field oxide layer 3. The dopants are simultaneously implanted into the polysilicon strip 40 to dope the same and make it conductive.

The amount of the extension of wings 41, and of the extension of mask 60 over the wings 41, is dictated by reasons of possible misalignments and/or statistic variations in dimensions. Specifically, the extension of the overlapping of mask 60 over the wings 41 must be sufficient so as to guarantee that, even taking into account the process tolerances for dimension variations and masks misalignments, the boundary 2 of the active area portion is protected against implantation. The extension of the wings 41 must be sufficient so as to guarantee that, in view of the above consideration on the extension of the overlapping, mask 60 does not extend over the polysilicon gate 40, and does not prevent the implantation of the dopants into substantially the whole polysilicon gate 40.

By the presented technique, it is possible to space apart the relatively heavily doped source/drain regions of the no-field transistor from the boundary of the field oxide layer, without however incurring the problems of the conventional techniques.

The present invention can be evidently applied to the formation of both N-channel and P-channel no-field transistors.

Additionally, even if the above description relates to the formation of a no-field transistor wherein both the relatively heavily doped drain and source regions are spaced-apart from the boundary of the field oxide layer, it is obvious that the present invention also applies to no-field transistors having only one relatively heavily doped region, either source or drain, spaced apart from the boundary of the field oxide layer. In this case, the mask 60 will have only one of the two arms shown in FIG. 3, and the wings 41 will be present only where the no-field area is required.

FIG. 3 additionally shows another preferred feature of the present invention, which will be now discussed.

It is known that in order to make the doped semiconductor regions, such as the source/drain regions of transistors, more conductive than they already are, it is possible to form a silicide layer at the surface thereof. This technique, called salicidation, provides for depositing over the doped semiconductor regions a layer of a transition metal such as cobalt, titanium or tungsten. Then, by means of a thermal process, the transition metal is made to react with the underlying doped silicon to form a layer of silicide. This layer is also referred to as "salicide", from self-aligned silicide, since it is formed in a self-aligned manner with the doped silicon regions. It is also known that lightly doped silicon regions are not to be salicided, to avoid strong leakage. To prevent salicidation of the lightly doped silicon regions, a protective mask (salicide protect) is applied to such regions before the deposition of the transition metal.

Reference numeral 70 in FIG. 3 denotes a salicide protect mask to be used in the context of the present invention when salicidation is provided for. In fact, since the regions of the active area portion near the boundary 2 of the field oxide layer 3 are not subject to the relatively heavy implant dose, they will be normally lightly doped, and as such they are not to be salicided. So, mask 70, which must be designed to be sufficiently wider than mask 60 to take into account the process tolerances, protects such lightly doped regions from reacting with the transition metal. The latter will only react with the relatively heavily doped source/drain regions 50, and with the polysilicon gate 40.

While preferred embodiments of the invention have been illustrated and described, it is to be understood that various changes may be made therein that do not depart from the spirit of the invention. Thus, the invention is to be limited only by the scope of the claims that follow and the equivalents thereof.

What is claimed is:

1. A method of fabrication of a no-field transistor, comprising:

defining an active area for the transistor surrounded by a field oxide layer;

placing a polysilicon gate electrode across the active area to define source/drain regions of the no-field transistor;

providing an implant protection mask over a boundary between at least one of the source/drain regions and the field oxide layer; and selectively implanting in said source/drain regions a relatively heavy dose of dopants to form relatively heavily doped source/drain regions and to simultaneously dope the polysilicon gate electrode, said polysilicon gate electrode is formed with lateral wings extending towards said at least one source/drain region, and said implant protection mask extends over said lateral wings but not over the polysilicon gate.

2. The method of claim 1, further comprising, after the implantation of the relatively heavy dose of dopants to form the relatively heavily doped source/drain regions, a salicide protection mask over the boundary between the at least one source/drain region, the salicide protection mask overlapping the lateral wings, and salicidating the relatively heavily doped source/drain regions.

3. A method for fabricating a transistor, comprising:

forming a polysilicon gate across an active area surrounded by a field oxide area to define source and drain regions, the polysilicon gate having lateral wings extending therefrom;

forming an implant protection mask over a boundary between the source and drain regions and the field oxide layer and over the lateral wings of the polysilicon gate; and selectively implanting with a dopant the source and drain regions and portions of the polysilicon gate not covered by the implant protection mask.

4. The method of claim 3, wherein the source and drain regions and the polysilicon gate are simultaneously implanted with the dopant.

5. The method of claim 4, wherein the lateral wings extend from end portions of the polysilicon gate.

6. The method of claim 4, wherein the lateral wings extend from the polysilicon gate toward both the source and the drain regions.

7. The method of claim 4, further comprising, after selectively implanting dopant, forming a salicide protection mask over a boundary between the source and drain regions and the field oxide area, the salicide protection mask overlapping the lateral wings, and subsequently salicidating the doped source and drain regions.

8. An integrated transistor, comprising:

a polysilicon gate surrounded by a field oxide, the polysilicon gate formed across an active area to define a source region and a drain region, the polysilicon gate having a doped central portion with undoped lateral wings extending therefrom, the source and drain regions implanted with a dopant.

9. The integrated transistor of claim 8, wherein the lateral wings extend from end portions of the polysilicon gate.

10. The integrated transistor of claim 8, wherein the lateral wings extend from the polysilicon gate toward the source and drain regions.

11. The integrated transistor of claim 8, wherein the source and drain regions are salicidated.

* * * * *